US009218571B2

(12) United States Patent
Abraham et al.

(10) Patent No.: US 9,218,571 B2
(45) Date of Patent: Dec. 22, 2015

(54) FREQUENCY SEPARATION BETWEEN QUBIT AND CHIP MODE TO REDUCE PURCELL LOSS

(71) Applicant: International Business Machines Corporation, Armonk, NY (US)

(72) Inventors: David W. Abraham, Croton, NY (US); Jerry M. Chow, White Plains, NY (US); Antonio D. Corcoles Gonzalez, Egham (GB); Jay M. Gambetta, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/604,938

(22) Filed: Jan. 26, 2015

(65) Prior Publication Data

US 2015/0325774 A1    Nov. 12, 2015

Related U.S. Application Data

(62) Division of application No. 13/828,263, filed on Mar. 14, 2013.

(51) Int. Cl.
| | |
|---|---|
| *H01L 29/06* | (2006.01) |
| *H01L 29/08* | (2006.01) |
| *H01L 31/0256* | (2006.01) |
| *H01L 39/22* | (2006.01) |
| *H01L 23/48* | (2006.01) |
| *H01L 27/00* | (2006.01) |
| *H01L 29/00* | (2006.01) |
| *H01L 45/00* | (2006.01) |
| *G06N 99/00* | (2010.01) |
| *B82Y 10/00* | (2011.01) |
| *H01L 49/00* | (2006.01) |
| *H01L 39/24* | (2006.01) |

(52) U.S. Cl.
CPC ............. *G06N 99/002* (2013.01); *B82Y 10/00* (2013.01); *H01L 39/22* (2013.01); *H01L 39/24* (2013.01); *H01L 49/006* (2013.01)

(58) Field of Classification Search
CPC . H01L 39/221–39/228; H01L 39/247–39/249; H01L 49/006; G06N 99/002
USPC ................... 257/9, 31, 34; 977/933; 505/190
See application file for complete search history.

(56) References Cited

U.S. PATENT DOCUMENTS

| | | |
|---|---|---|
| 3,020,543 A | 2/1962 | Li |
| 3,964,014 A | 6/1976 | Tehon |
| 4,561,067 A | 12/1985 | McKeown |
| 4,725,797 A | 2/1988 | Thompson et al. |

(Continued)

OTHER PUBLICATIONS

H. Wang, et al. "Improving the coherence time of superconducting coplanar resonators", Applied Phts. Lett. 95, 2009, 233508.*

(Continued)

*Primary Examiner* — Brett Feeney
*Assistant Examiner* — Erik T Peterson
(74) *Attorney, Agent, or Firm* — Cantor Colburn LLP; Vazken Alexanian

(57) ABSTRACT

A system, method, and chip to control Purcell loss are described. The chip includes qubits formed on a first surface of a substrate. The method includes determining frequencies of the qubits, and controlling a separation between the frequencies of the qubits and chip mode frequencies of the chip.

6 Claims, 4 Drawing Sheets

(56) References Cited

U.S. PATENT DOCUMENTS

| | | | |
|---|---|---|---|
| 5,107,586 | A | 4/1992 | Eichelberger et al. |
| 5,912,472 | A | 6/1999 | Voigtlaender et al. |
| 6,130,483 | A | 10/2000 | Shizuki et al. |
| 6,156,165 | A | 12/2000 | Pierson et al. |
| 6,232,854 | B1 | 5/2001 | Mikami et al. |
| 6,297,551 | B1 | 10/2001 | Dudderar et al. |
| 6,900,454 | B2 | 5/2005 | Blais et al. |
| 7,321,884 | B2 | 1/2008 | Burkard et al. |
| 7,830,022 | B2 | 11/2010 | Theuss et al. |
| 7,834,422 | B2 | 11/2010 | Andresen et al. |
| 7,847,615 | B2 | 12/2010 | Yorozu et al. |
| 7,932,514 | B2 | 4/2011 | Farinelli et al. |
| 8,247,799 | B2 | 8/2012 | Bunyk et al. |
| 2005/0001209 | A1 | 1/2005 | Hilton et al. |
| 2005/0184284 | A1 | 8/2005 | Burkard et al. |
| 2006/0225165 | A1 | 10/2006 | Maassen van den Brink et al. |
| 2009/0122885 | A1 | 5/2009 | Anilkumar et al. |
| 2009/0167342 | A1 | 7/2009 | van den Brink et al. |
| 2011/0022340 | A1 | 1/2011 | Divincenzo et al. |
| 2011/0022820 | A1 | 1/2011 | Bunyk et al. |
| 2011/0152104 | A1 | 6/2011 | Farinelli et al. |
| 2012/0098698 | A1 | 4/2012 | Reuter |
| 2012/0208320 | A1 | 8/2012 | Barth et al. |
| 2012/0319085 | A1 | 12/2012 | Gambetta et al. |
| 2012/0326720 | A1 | 12/2012 | Gambetta et al. |

OTHER PUBLICATIONS

C. Rigetti, et al. "Superconducting qubit in a waveguide cavity with a coherence time approaching 0.1 ms", Phys. Rev. B., 86, 2012, 100506(R).*

Altomare et al., "Measurement crosstalk between two phase qubits coupled by a coplanar waveguide", Physical Review B, vol. 82, (2010), pp. 1-7.

Ansmann et al., "Violation of Bell's inequality in Josephson phase qubits", Nature, vol. 461, Sep. 24, 2009, pp. 504-506.

Blanvillain et al., "Suppressing on-chip electromagnetic crosstalk for spin qubit devices", Journal of Applied Physics, vol. 112, (2012), pp. 1-6.

Gambetta et al., "Characterization of addressability by simultaneous randomized benchmarking", arXiv 1204 6308, Apr. 27, 2012, pp. 1-5.

Gambetta et al., "Entanglement of Two Superconducting Qubits in a Waveguide Cavity via Monochromatic Two-Photon Excitation", Physical Review Letters, 2012, pp. 1-5.

Gambetta et al., "Improved superconducting qubit coherence using titanium nitride", Applied Physics Letters, Jul. 3, 2013, pp. 1-4.

Gambetta et al., "Superconducting Qubit with Purcell Protection and Tunable Coupling" Physical Review Letters, vol. 106, (2011), pp. 1-4.

Houck et al., "Controlling the Spontaneous Emission of a Superconducting Transmon Qubit" Physical Review Letters, vol. 101, (2008), pp. 1-4.

International Search Report and Written Opinion for PCT Application No. PCT/IB2014/058420, dated May 13, 2014, pp. 1-7.

International Search Report and Written Opinion for PCT Application No. PCT/IB2014/058432, dated Mar. 11, 2014, pp. 1-6.

Reed et al., "Fast reset and suppressing spontaneous emission of a superconducting qubit", Applied Physics Letters, vol. 96, (2010), pp. 1-3.

Rigetti et al., "Fully microwave-tunable universal gates in superconducting qubits with linear couplings and fixed transition frequencies", Physical Review B, vol. 81, (2010), pp. 1-7.

Wenner et al., "Wirebond crosstalk and cavity modes in large chip mounts for superconducting qubits", Supercond. Sci. Technol., vol. 24, (2011), pp. 1-7.

Rigetti et al., "Superconducting qubit in a waveguide cavity with a coherence time approaching 0.1 ms", Physical Review, 2012, pp. 1-5.

* cited by examiner

FREQUENCY SEPARATION BETWEEN QUBIT AND CHIP MODE TO REDUCE PURCELL LOSS

DOMESTIC BENEFIT/NATIONAL STAGE INFORMATION

This application is a divisional of U.S. application Ser. No. 13/828,263 filed Mar. 14, 2013, the disclosure of which is incorporated by reference herein in its entirety.

FEDERAL RESEARCH STATEMENT

This invention was made with Government support under Contract No.: W911NF-10-1-0324 awarded by the U.S. Army. The Government has certain rights in this invention.

BACKGROUND

The present invention relates to a quantum computing chip, and more specifically, to separating chip mode frequencies from quantum bit frequencies.

In quantum computing, a quantum bit (qubit) is a quantum oscillator that eventually experiences undesirable perturbations in the oscillation amplitude and phase (T1 and T2 relaxation). Longer coherence times (larger values for T1 and T2) correspond with a longer time to perform quantum operations before the system decoheres. Several factors may contribute to the perturbations in the oscillation and hasten the T1 and T2 relaxation. A circuit comprising the qubits, resonators, and signal ports is formed as a thin film on a substrate. The substrate itself may be one source of decoherence. The substrate, typically formed of an insulating material with a high dielectric constant, may be viewed as a microwave resonator with chip resonant modes (chip modes) that may be close to the qubit frequency such that they couple with the qubit frequency and cause decoherence (which we refer to here as the Purcell effect or Purcell loss).

SUMMARY

According to one embodiment of the present invention, a method of controlling Purcell loss in qubits formed on a first surface of a substrate of a chip includes determining frequencies of the qubits; and controlling a separation between the frequencies of the qubits and chip mode frequencies of the chip.

According to another embodiment of the invention, a system to control Purcell in qubits included on a chip includes a processor configured to compute qubit frequencies and chip mode frequencies; and a substrate designed based on the processor computations.

According to yet another embodiment of the invention, a chip with controlled Purcell loss includes qubits formed on a first surface of a substrate; and the substrate designed to control the Purcell loss in the qubits.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As noted above, chip modes (substrate resonant frequencies) of the substrate may be a source of perturbations in the oscillation of the qubits or Purcell loss. The chip modes may create crosstalk between qubits or introduce noise from the environment into the qubits. Embodiments of the invention described herein relate to ensuring separation between the chip mode frequencies and qubit resonance frequencies as a way to address the coupling.

Figure 1:
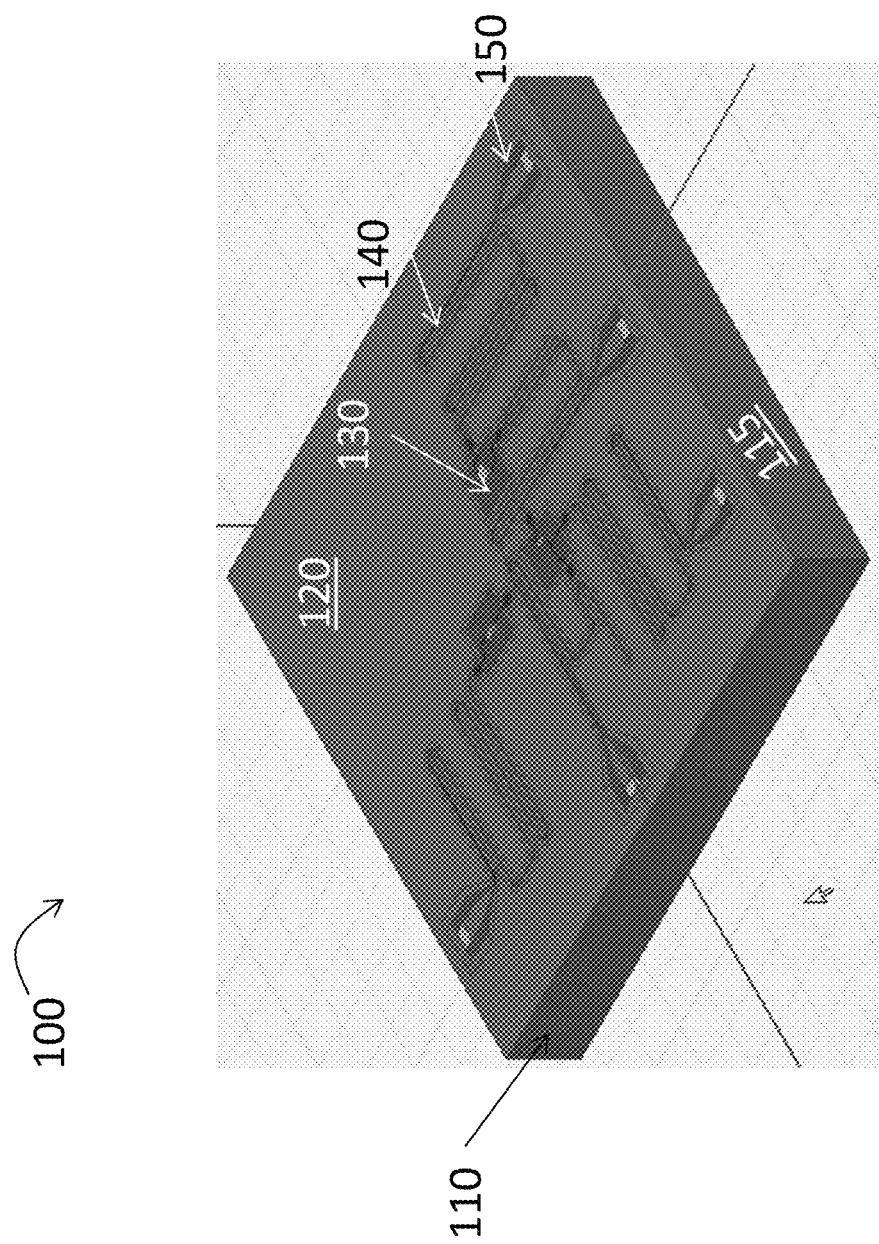
FIG. 1 is a three-dimensional view of a chip according to an embodiment of the invention.

FIG. 1 is a three-dimensional view of a chip 100 according to an embodiment of the invention. The substrate 110 may be a silicon or sapphire wafer. The circuit 120 is patterned as thin metal and insulating films on top of the substrate 110. The circuit 120 includes qubits 130 that are interrogated by microwave pulses through their interaction with microwave resonators 140. The circuit 120 also includes ports 150 through which drive signals are introduced and output signals of the circuit 120 are received. Coupling of spurious energy into the qubit 130 may be caused by the resonators 140 or another energy reservoir such as chip modes, as noted above. A way to quantify the degree to which a qubit 130 is successfully isolated from the environment is to measure the coherence times (T1 for amplitude and T2 for phase) of the qubit 130. The equation below indicates factors affecting T1 for the exemplary perturbation to qubit 130 oscillation caused by a resonator 140:

$$T1 = \frac{Q}{2\pi F_r}\left(\frac{F_r - F_q}{g}\right)^2 \quad [\text{EQ. 1}]$$

where Q is a resonator quality factor, $F_r$ is the resonator frequency, $F_q$ is the qubit frequency, and g represents the coupling between the resonator and qubit. The resonator referred to in this expression may be an intentionally fabricated structure such as the resonator 140 in FIG. 1, or may be lossy chip modes within the substrate 110. As indicated by Eq. 1 above, an increase in coupling (increase in g) to the resonator 140 (or other reservoir) causes T1 to decrease because T1 and g are inversely proportional. Eq. 1 also indicates that an increased separation in the qubit 130 and reservoir (resonator 140) frequencies or increase in the frequency difference ($F_r - F_q$) (the numerator) causes an increase in T1. Considering a substrate as an energy reservoir, the chip resonant frequency (Fr) may be close to the qubit frequency ($F_q$), such that ($F_r - F_q$) is a relatively small value and, thus, T1 is a relatively small value. In view of Eq. 1, to the extent that decoherence is caused by coupling to chip modes, one way to increase T1 is by increasing the separation between chip resonant frequencies and qubit frequencies.

Figure 2:
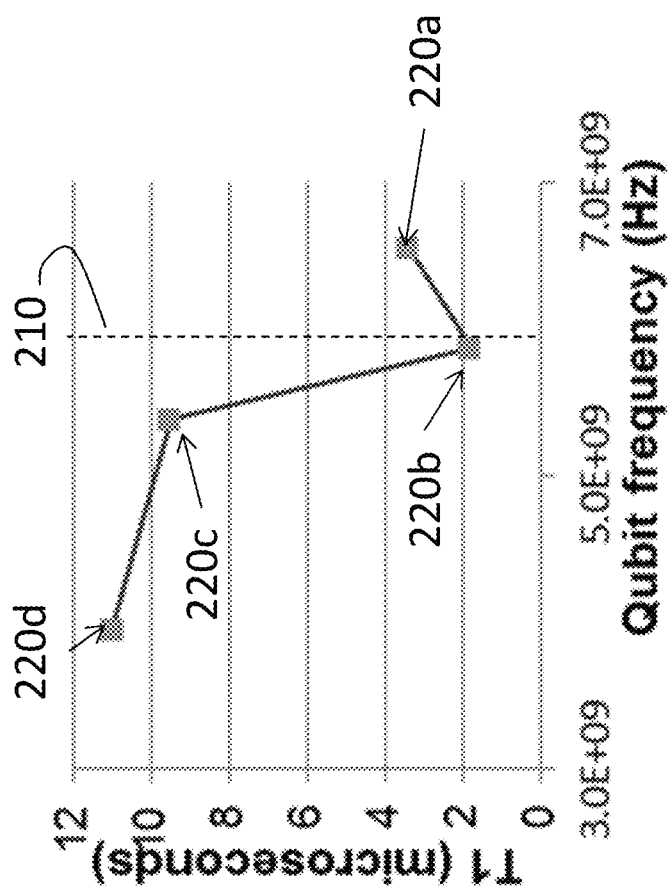
FIG. 2 shows T1 as a function of qubit frequency for a given chip resonant frequency.

FIG. 2 shows T1 as a function of qubit frequency for a given chip resonant frequency. The exemplary chip resonant frequency 210 is 6 gigahertz (GHz). Four qubits 130 with four different frequencies 220 are shown. As FIG. 2 indicates, as the difference between a qubit frequency 220 and the chip resonant frequency 210 increases, T1 increases. For example, qubit frequency 220d is farthest from the chip resonant frequency 210 and corresponds with the highest T1 value in FIG. 2, while qubit frequency 220b is the closest to the chip resonant frequency 210 and corresponds with the lowest T1 value in FIG. 2.

An increase in separation between qubit 130 frequencies and chip resonant frequency may be brought about by applying a coating 115 (FIG. 1) to one or more edges of the substrate 110. A metal coating 115 on one or more edges of the substrate 110 shifts the chip modes or resonant frequencies to higher values. For typical geometries and substrate 110 materials, the resonant frequencies may nearly double based on applying a coating 115 of metal. The coating 115 changes the boundary conditions of the substrate 110 and thereby increases the chip mode to a higher frequency. When all four edges of the substrate 110 have the coating 115 applied, the chip mode corresponds to a drum mode, in which the outer edges of the substrate 110 have 0 electric field. An exemplary shift in the chip mode may be from 6 GHz (shown in reference to FIG. 2) to 10 GHz based on the coating 115. Based on this shift in the chip mode, which separates the chip resonant frequency from the highest qubit frequency (less than 7 GHz as shown in FIG. 2), a reduction in T1 based on Purcell loss to the chip modes is minimized.

Eq. 1 above indicates that the resonator quality factor (Q) and T1 are directly proportional such that a high Q value (indicating a lower rate of energy loss relative to stored energy of a resonator) corresponds with a high T1 value. In order to have the chip mode at the highest Q, the coating 115 may be a superconducting material. In addition, the metal coating 115 may include an adhesion layer as part of the coating 115. For example, the coating 115 may be comprised of a coating of Titanium (Ti) (approximately 50 Angstrom) and a coating of Aluminum (Al) (approximately 500 Angstrom). The coating 115 may be applied, for example, using two passes of electron beam evaporation.

Figure 3:
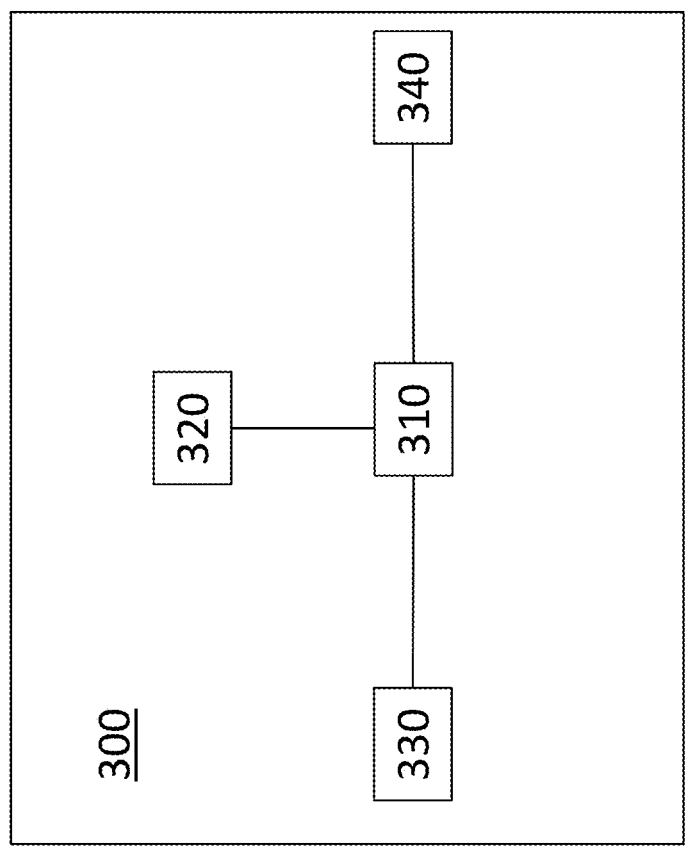
FIG. 3 is a block diagram of a system to calculate chip mode frequencies according to an embodiment of the invention.

FIG. 3 is a block diagram of a system 300 to calculate chip mode frequencies according to an embodiment of the invention. Through the system 300, the effect of applying the coating 115 may be simulated, for example, such that chip mode frequencies resulting from applying the coating 115 to one, two, three, or all four sides may be predicted. Through the prediction, a determination may be made of the number of sides to which to apply the coating 115 in order to achieve the greatest separation or a necessary separation for a desired T1 between chip mode frequencies and qubit frequencies. The system 300 includes one or more processors 310, one or more memory devices 320, an input interface 330, and an output interface 340, which may include a display device. The one or more processors 310 may process instructions stored in the memory device 320 to execute a software tool (e.g., high frequency structural simulator (HFSS)) to calculate chip mode frequencies for specified chip 100 conditions including application of the coating 115 to a specified number of edges of the substrate 100.

An increased separation between qubit 130 frequencies and chip resonant frequencies may also be achieved by controlling the dimensions of the chip 100. Chip mode frequencies decrease as chip 100 (substrate 110) size increases. Thus, by scaling the number of qubits 130 and resonators 140 and determining chip 100 size such that no chip modes exist which have frequencies close to the qubit frequencies, the necessary separation ((Fr−Fq) in Eq. 1) may be achieved for a desired minimum T1. In one embodiment, the qubits 130 may be placed on a substrate 110 with dimensions such that all chip modes are of higher frequencies than the qubit frequencies, with sufficient separation between the chip mode and qubit frequencies so that T1 losses are minimized. In another embodiment, the minimum substrate frequency may be below at least some of the qubit frequencies. In this case, the chip mode frequencies would be designed to be as far as possible from the qubit frequency (either above and below) in order to maximize coherence of the qubit. The software tool discussed above (e.g., HFSS) may be used to design the dimensions of the chip 100 to obtain desired chip mode frequencies.

Figure 4:
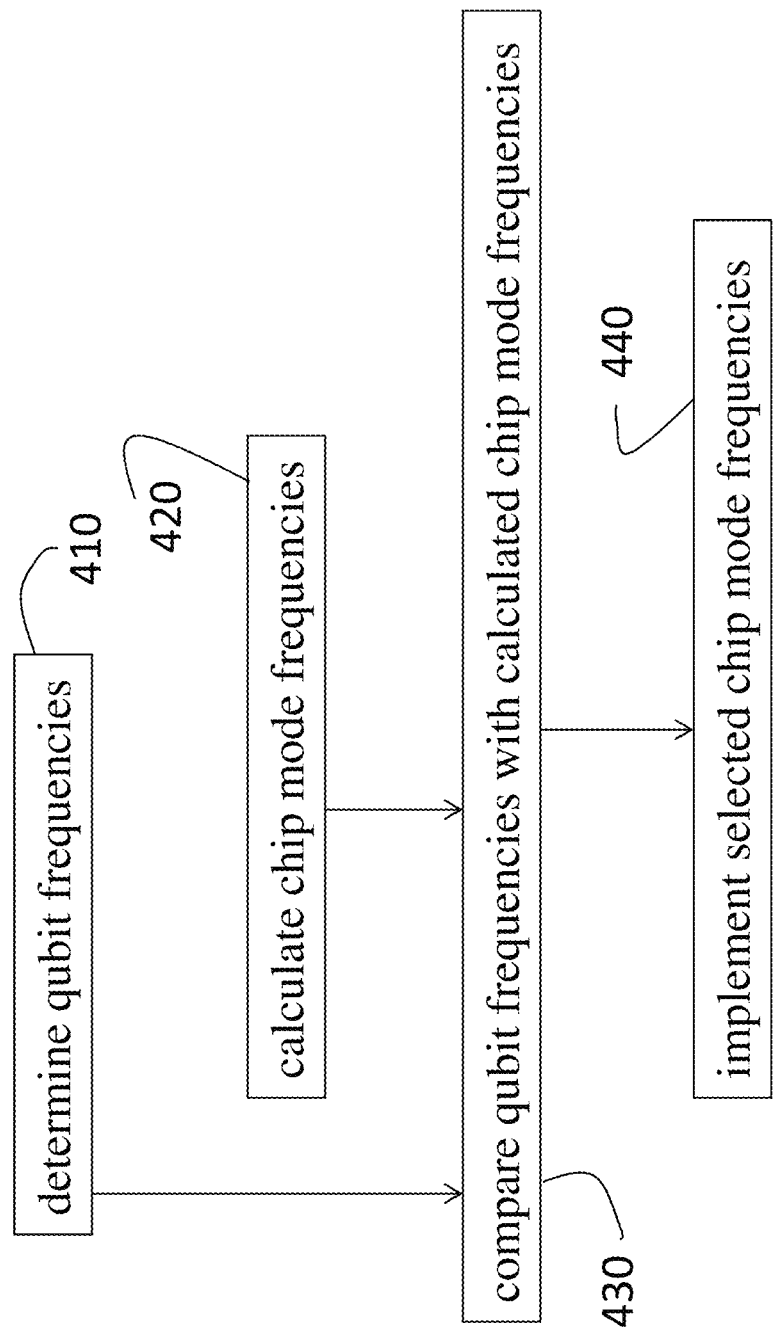
FIG. 4 is a flow diagram of a method of reducing Purcell loss according to embodiments of the invention.

FIG. 4 is a flow diagram of a method of reducing Purcell loss according to embodiments of the invention. The method illustrated by FIG. 4 may also be regarded as a method of separating qubit frequencies and chip mode frequencies according to embodiment of the invention. As discussed above, an increased separation in the frequencies (increased (Fr−Fq) in Eq. 1) results in an increased T1 relaxation time. The method includes determining qubit frequencies at block 410. At block 420, calculating chip mode frequencies may be as a function of the number of edges of the chip 100 to which the coating 115 is applied. This calculating includes calculating the chip mode frequencies for each of one, two, three, and four coated edges. At block 420, calculating chip mode frequencies may instead be as a function of the chip 100 dimensions. For example, two or more dimensions may be selected for processing in this manner. The calculating itself may be performed using a tool (e.g., HFSS) as discussed above. Comparing qubit frequencies with the calculated chip mode frequencies at block 430 may be comparing the qubit frequencies and chip mode frequencies for each of the number of coated edges. The comparison indicates which chip mode frequencies (which number of coated edges) result in the maximum separation from the qubit frequencies. Comparing at block 430 may instead include comparing qubit frequencies with chip mode frequencies calculated for the different dimensions of the chip 100. This comparison indicates which of the dimensions of the chip 100 result in the maximum separation from the qubit frequencies. Implementing the selected chip mode frequencies at block 440 based on the comparison may include applying the coating 115 based on the comparison by selecting the number of edges to coat based on which chip mode frequencies (which number of coated edges) resulted in the maximum separation from the qubit frequencies. Implementing the selected chip mode frequencies at block 440 may instead include designing the chip 100 dimensions according to the dimensions that resulted in the maximum separation from the qubit frequencies.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one more other features, integers, steps, operations, element components, and/or groups thereof.

The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated The flow diagram depicted herein is just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A chip with controlled Purcell loss, the chip comprising:
   a substrate having a top surface and four edges adjacent and perpendicular to the top surface;
   the substrate comprising a circuit and microwave resonators formed on the top surface;
      wherein the circuit includes qubits; and
   at least one or more of the four edges of the substrate are coated with a metal;
      wherein the metal coating changes boundary conditions of the substrate thereby increasing chip mode frequencies to control the Purcell loss of the chip.

2. The chip according to claim 1, wherein the metal is titanium (Ti).

3. The chip according to claim 2, wherein the titanium coating is approximately 50 angstroms thick.

4. The chip according to claim 1, wherein the metal is aluminum (Al).

5. The chip according to claim 4, wherein the aluminum coating is approximately 500 angstroms thick.

6. The chip according to claim 1, wherein the substrate is silicon or sapphire.

* * * * *